United States Patent
Chou et al.

(10) Patent No.: US 10,798,846 B2
(45) Date of Patent: Oct. 6, 2020

(54) COOLANT REPLENISHMENT DEVICE, COOLING CIRCULATION SYSTEM, AND ELECTRONIC DEVICE

(71) Applicant: WISTRON CORP., New Taipei (TW)

(72) Inventors: Chih-Sheng Chou, New Taipei (TW); Jen-Hao Wu, New Taipei (TW)

(73) Assignee: WISTRON CORP., New Taipei (TW)

( * ) Notice: Subject to any disclaimer, the term of this patent is extended or adjusted under 35 U.S.C. 154(b) by 185 days.

(21) Appl. No.: 15/983,067

(22) Filed: May 17, 2018

(65) Prior Publication Data
US 2019/0223322 A1    Jul. 18, 2019

(30) Foreign Application Priority Data

Jan. 17, 2018 (TW) .............................. 107101633 A

(51) Int. Cl.
*H05K 7/20* (2006.01)
*H01L 23/473* (2006.01)
(Continued)

(52) U.S. Cl.
CPC ........... *H05K 7/20272* (2013.01); *G06F 1/20* (2013.01); *H01L 23/427* (2013.01); *H01L 23/473* (2013.01); *H05K 7/20772* (2013.01)

(58) Field of Classification Search
CPC ........... H05K 7/20272; H05K 7/20772; H05K 7/20372; G06F 1/20; H01L 23/427;
(Continued)

(56) References Cited

U.S. PATENT DOCUMENTS 1,732,505 A * 10/1929 Dawson ................ F24D 3/1008
                                                      237/66
3,148,829 A * 9/1964 Leopardo .............. F24D 19/087
                                                      236/66
(Continued)

FOREIGN PATENT DOCUMENTS

CN    106163228 A    11/2016
CN    107420879 A    12/2017

OTHER PUBLICATIONS

CN Office Action in Application No. 201810151278.7 dated Jun. 23, 2020.

*Primary Examiner* — Travis C Ruby
(74) *Attorney, Agent, or Firm* — Maschoff Brennan

(57) ABSTRACT

The disclosure is related to a coolant replenishment device, a cooling circulation system and an electronic device. The electronic device includes a heat source, a circulation pipe, a pump, a heat exchanger and a coolant replenishment device. The circulation pipe has a circulation channel configured to accommodate a first coolant. The pump is disposed on the circulation pipe. The heat exchanger disposed on the circulation pipe. The coolant replenishment device includes a liquid storage tank, a push plate and a driving member. The liquid storage tank has an accommodating space configured to accommodate a second coolant. The push plate is movable toward or away from the liquid outlet. The driving member is disposed in the liquid storage tank and constantly apply a force on the push plate to push the second coolant from the accommodating place into the circulation channel through the liquid outlet.

23 Claims, 7 Drawing Sheets

(51) Int. Cl.
*G06F 1/20* (2006.01)
*H01L 23/427* (2006.01)

(58) Field of Classification Search
CPC . H01L 23/473; H01L 23/4332; F24D 3/1008; F24D 3/1016; F24D 3/1083; F24D 19/083; F24D 19/087; F16L 55/05; F16L 55/07
See application file for complete search history.

(56) References Cited

U.S. PATENT DOCUMENTS

| | | | | |
|---|---|---|---|---|
| 3,445,863 A * | 5/1969 | Wada | | A61F 2/2403 623/2.2 |
| 3,559,727 A * | 2/1971 | Hill | | B64D 13/00 165/11.1 |
| 3,651,863 A * | 3/1972 | Hughes | | B64D 13/00 165/11.1 |
| 3,677,334 A * | 7/1972 | Bathla | | F28F 27/00 165/11.1 |
| 4,037,045 A * | 7/1977 | Beriger | | H05K 7/20272 174/15.1 |
| 4,302,793 A * | 11/1981 | Rohner | | H05K 7/20272 174/15.1 |
| 4,345,715 A * | 8/1982 | Van Craenenbroeck | | F24D 3/1016 237/66 |
| 4,625,790 A * | 12/1986 | Okayasu | | F28D 15/0266 165/104.22 |
| 4,729,060 A * | 3/1988 | Yamamoto | | H01L 23/4332 361/700 |
| 4,790,369 A * | 12/1988 | Avrea | | F01P 11/0238 123/41.51 |
| 4,792,283 A * | 12/1988 | Okayasu | | F04F 1/04 417/209 |
| 4,881,593 A * | 11/1989 | Okayasu | | F28D 15/02 165/104.29 |
| 4,930,570 A * | 6/1990 | Okayasu | | H05K 7/20272 165/104.14 |
| 5,048,599 A * | 9/1991 | Tustaniwskyj | | F24D 19/083 165/104.32 |
| 5,137,079 A * | 8/1992 | Anderson | | F01P 7/16 165/104.33 |
| 5,176,112 A * | 1/1993 | Sausner | | F01P 3/2271 123/41.21 |
| 5,392,812 A * | 2/1995 | Herron | | F16K 15/03 137/527.8 |
| 5,577,910 A * | 11/1996 | Holland | | A61C 17/065 433/92 |
| 5,816,313 A * | 10/1998 | Baker | | F16K 15/048 165/41 |
| 2003/0151892 A1 * | 8/2003 | Kondo | | G06F 1/203 361/679.53 |
| 2004/0001312 A1 * | 1/2004 | Hotta | | G06F 1/203 361/679.47 |
| 2005/0257838 A1 * | 11/2005 | Enerson | | F16K 15/023 137/528 |
| 2006/0065874 A1 * | 3/2006 | Campbell | | H05K 7/20772 251/348 |
| 2007/0002539 A1 * | 1/2007 | Aoki | | G01M 3/228 361/699 |
| 2008/0013278 A1 * | 1/2008 | Landry | | G06F 1/20 361/699 |
| 2009/0116938 A1 * | 5/2009 | Wakabayashi | | F16K 15/03 414/217.1 |
| 2009/0166575 A1 * | 7/2009 | Bereznai | | F16K 15/148 251/368 |
| 2009/0218072 A1 * | 9/2009 | Eriksen | | H05K 7/20272 165/80.2 |
| 2009/0277657 A1 * | 11/2009 | Berger | | F16N 7/14 173/114 |
| 2011/0016898 A1 * | 1/2011 | Ghesquiere | | F24H 1/102 62/238.7 |
| 2011/0176273 A1 * | 7/2011 | Olsen | | G06F 1/20 361/679.47 |
| 2012/0031105 A1 * | 2/2012 | Thiyagarajan | | F16K 17/0413 60/782 |
| 2012/0106071 A1 * | 5/2012 | Eagle | | G06F 1/20 361/679.47 |
| 2012/0180979 A1 * | 7/2012 | Harrington | | H05K 7/20281 165/11.1 |
| 2013/0000761 A1 * | 1/2013 | Stevens | | F16H 57/0447 137/593 |
| 2013/0020057 A1 * | 1/2013 | Suzuki | | H05K 7/20772 165/104.31 |
| 2013/0139903 A1 * | 6/2013 | Haas | | F01P 11/029 137/197 |
| 2013/0319635 A1 * | 12/2013 | Kobayashi | | H05K 7/20927 165/104.11 |
| 2014/0014213 A1 * | 1/2014 | Hull | | A61B 17/00491 137/883 |
| 2014/0218861 A1 * | 8/2014 | Shelnutt | | H05K 7/20809 361/679.53 |
| 2015/0010030 A1 * | 1/2015 | Hirota | | H01S 3/04 372/35 |
| 2016/0067815 A1 * | 3/2016 | Nicewonger | | F16K 37/005 219/120 |
| 2016/0153595 A1 * | 6/2016 | Arvelo | | F16L 21/002 285/332 |
| 2016/0338224 A1 * | 11/2016 | Chen | | F04B 17/04 |
| 2016/0366786 A1 * | 12/2016 | Liao | | B67D 3/0025 |
| 2016/0366787 A1 * | 12/2016 | Liao | | B67D 7/362 |
| 2016/0366788 A1 * | 12/2016 | Liao | | H05K 7/20272 |
| 2016/0379852 A1 * | 12/2016 | Tustaniwskyj | | H01L 21/67109 165/296 |
| 2017/0034950 A1 * | 2/2017 | Sung | | G06F 1/20 |
| 2017/0079166 A1 * | 3/2017 | Chen | | H05K 7/20327 |
| 2017/0181325 A1 * | 6/2017 | Shelnutt | | H05K 7/20272 |
| 2017/0351305 A1 * | 12/2017 | Wei | | F28D 20/0034 |

* cited by examiner

US 10,798,846 B2

COOLANT REPLENISHMENT DEVICE, COOLING CIRCULATION SYSTEM, AND ELECTRONIC DEVICE

CROSS-REFERENCE TO RELATED APPLICATIONS

This non-provisional application claims priority under 35 U.S.C. § 119(a) on Patent Application No(s). 107101633 filed in Taiwan, R.O.C. on Jan. 17, 2018, the entire contents of which are hereby incorporated by reference.

TECHNICAL FIELD

The disclosure relates to a coolant replenishment device, more particularly to a coolant replenishment device that utilizes pressure difference to replenish coolant automatically, a cooling circulation system, and an electronic device having the same.

BACKGROUND

As the computer technology progresses, electronic components such as, CPUs or GPUs provide better performance but also generate more heat. Conventional air-cooling systems were not sufficient to cool these electronic components. Thus, a liquid-cooling system that has an improved heat dissipation ability gradually replaces the air-cooling system.

The liquid-cooling system is driven by a pump, and the pump can force the coolant to flow through the electronic component and absorb the heat generated by the electronic component. However, the coolant is vaporized while absorbing the heat, and the vaporized coolant would easily escape from the system, resulting the loss of the coolant. As a result, users need to regularly replenish the coolant.

Generally, a coolant replenishment device is a tank that is disposed vertically above the system, such that the coolant replenishment device can inject the coolant into the system with the help of the height difference. However, the computer or server has a limited height, this limits the height difference required by replenishing the coolant. If the height difference is off standard, the coolant would be hard to be replenished into the system.

SUMMARY OF THE INVENTION

One embodiment of the disclosure provides a coolant replenishment device which includes a liquid storage tank, a push plate and a driving member. The liquid storage tank has an accommodating space and a liquid outlet. The liquid outlet is communicated to the accommodating space, and the accommodating space is configured to accommodate a coolant. The push plate is movably located in the accommodating space and movable in a direction toward or away from the liquid outlet. The driving member is disposed in the liquid storage tank and constantly apply a force on the push plate in the direction toward the liquid outlet so as to force the push plate to move toward the liquid outlet to push the coolant out of the accommodating space.

Another embodiment of the disclosure provides a cooling circulation system which includes a circulation pipe, a pump, and a coolant replenishment device. The circulation pipe has a circulation channel, and the circulation channel is configured to accommodate a first coolant. The pump is disposed on the circulation pipe and configured to force the first coolant flow through the circulation channel. The coolant replenishment device is disposed on and connected to the circulation pipe, and the coolant replenishment device includes a liquid storage tank, a push plate and a driving member. The liquid storage tank has an accommodating space and a liquid outlet. The liquid outlet is communicated to the accommodating space and the circulation channel, and the accommodating space is configured to accommodate a second coolant. The push plate is movably located in the accommodating space and movable in a direction toward or away from the liquid outlet. The driving member is disposed in the liquid storage tank and constantly apply a force on the push plate in the direction toward the liquid outlet so as to force the push plate to move toward the liquid outlet to push the second coolant from the accommodating place into the circulation channel through the liquid outlet.

Still another embodiment of the disclosure provides an electronic device which includes a heat source, a circulation pipe, a pump, a heat exchanger and a coolant replenishment device. The heat source is configured to produce heat. The circulation pipe is in thermal contact with the heat source so as to remove part of the heat, wherein the circulation pipe has a circulation channel configured to accommodate a first coolant. The pump is disposed on the circulation pipe and configured to force the first coolant to flow through the circulation channel. The heat exchanger disposed on the circulation pipe and configured to dissipate the heat to cool the first coolant. The coolant replenishment device is disposed on and connected to the circulation pipe, and the coolant replenishment device includes a liquid storage tank, a push plate and a driving member. The liquid storage tank has an accommodating space and a liquid outlet. The liquid outlet is communicated to the accommodating space and the circulation channel, and the accommodating space is configured to accommodate a second coolant. The push plate is movably located in the accommodating space and movable in a direction toward or away from the liquid outlet. The driving member is disposed in the liquid storage tank and constantly apply a force on the push plate in the direction toward the liquid outlet so as to force the push plate to move toward the liquid outlet to push the second coolant from the accommodating place into the circulation channel through the liquid outlet.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
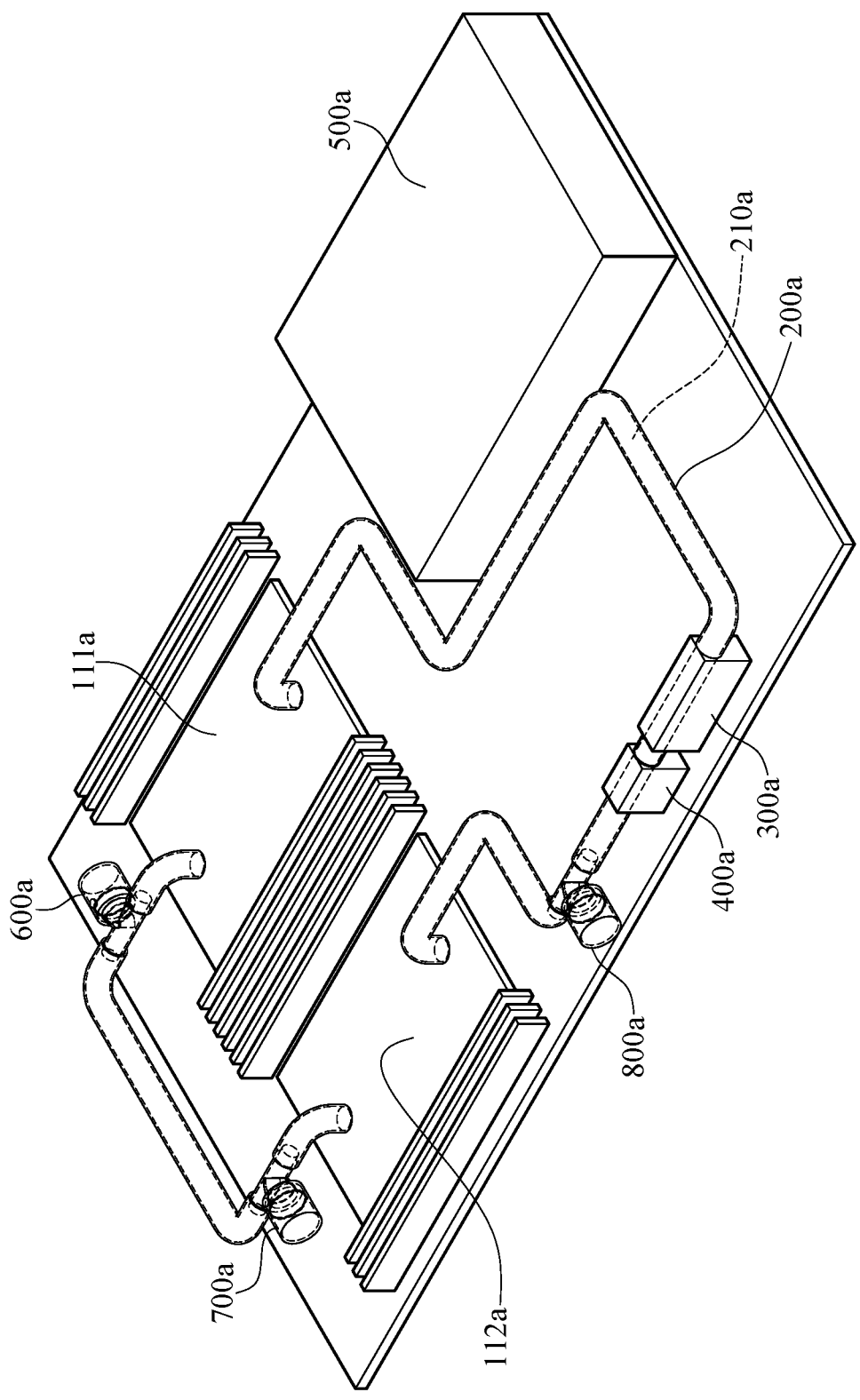
FIG. 1 is a perspective view of an electronic device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
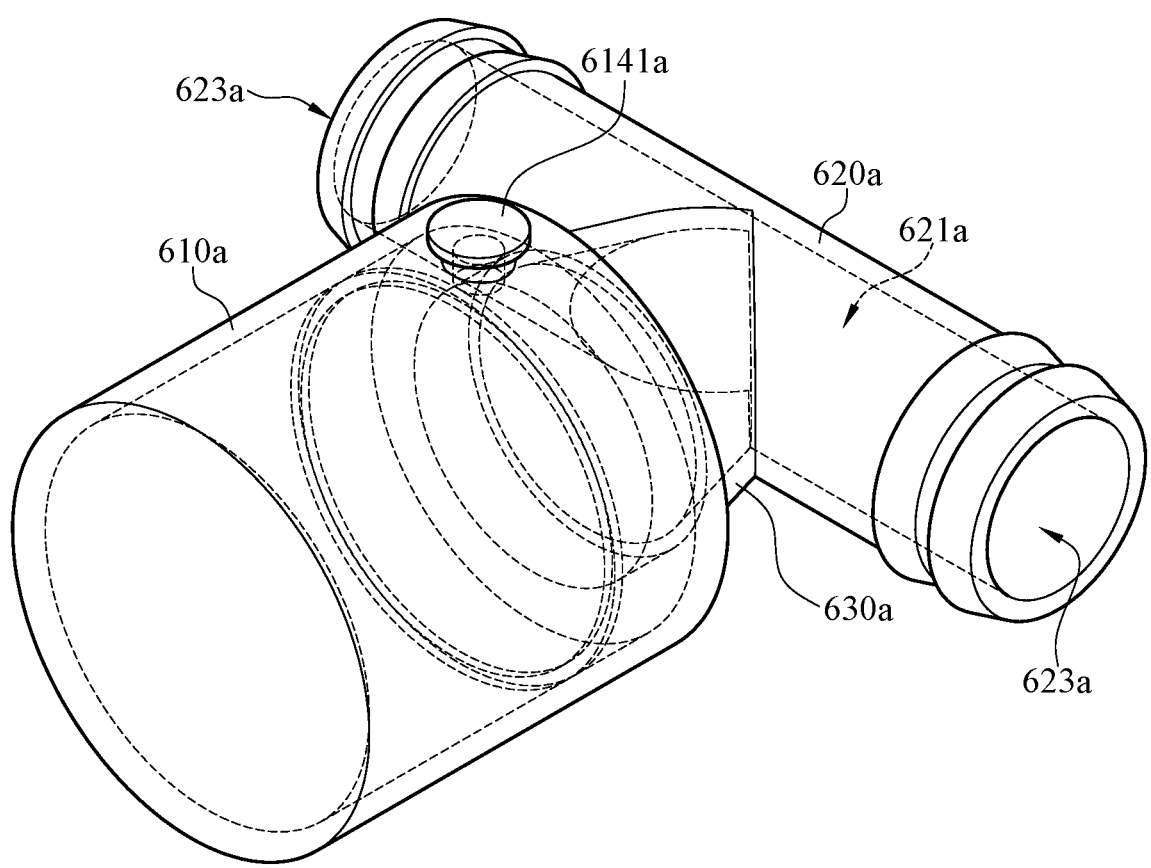
FIG. 2 is a perspective view of a coolant replenishment device of the electronic device in FIG. 1.
Figure 3:
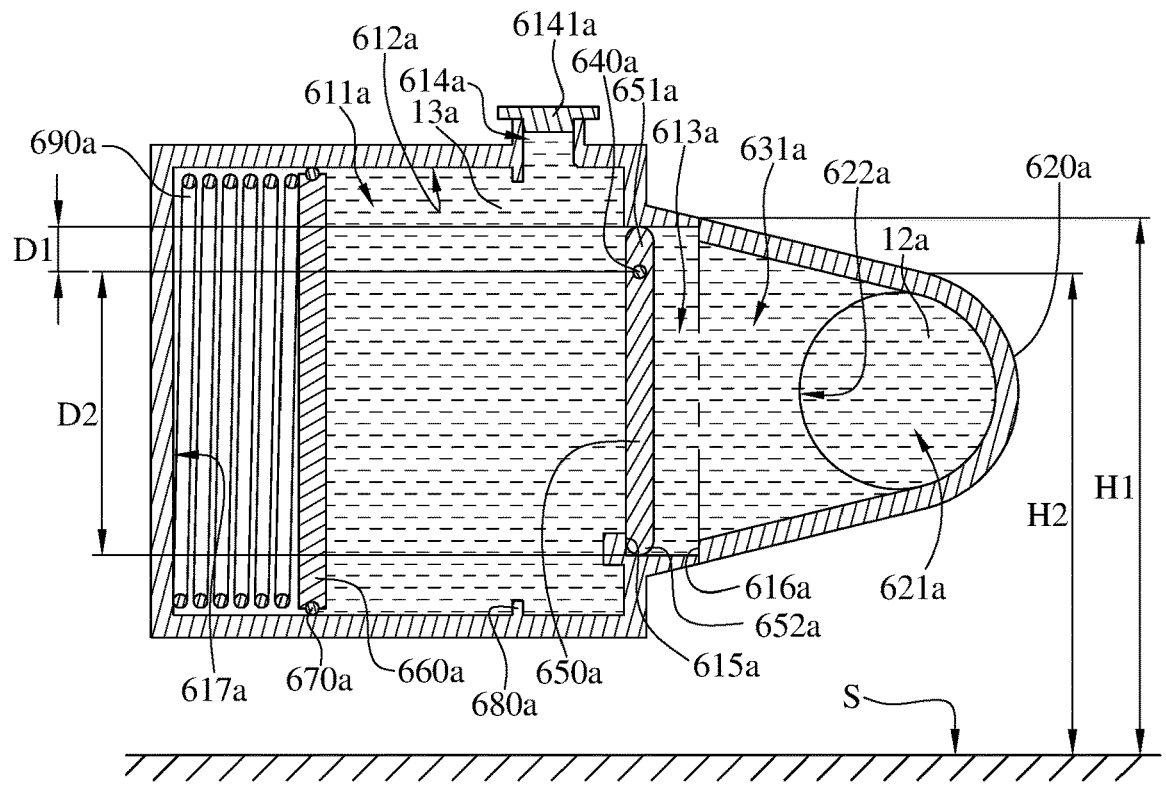
FIG. 3 is a cross-sectional view of the coolant replenishment device in FIG. 2 when a valve is closed and the pressure is balanced.

Please refer to FIG. 1 and FIG. 3. FIG. 1 is a perspective view of an electronic device according to a first embodiment of the disclosure. FIG. 2 is a perspective view of a coolant replenishment device of the electronic device in FIG. 1. FIG. 3 is a cross-sectional view of the coolant replenishment device in FIG. 2 when a valve is closed and the pressure is balanced.

As shown in FIG. 1, an electronic device 10a includes two heat sources 111a and 112a, a circulation pipe 200a, a pump 300a, a heat exchanger 400a, a power supply unit 500a, a first coolant replenishment device 600a, a second coolant replenishment device 700a and a third coolant replenishment device 800a.

In this embodiment, the electronic device 10a is, for example, a server, and the two heat sources 111a and 112a are, for example, CPUs. The heat sources 111a and 112a produce heat during operation. It is noted that the disclosure is not limited to the quantity of the heat sources in the electronic device. For example, in some other embodiments, the electronic device may contain only one heat source or more than two heat sources.

The circulation pipe 200a is in thermal contact with the heat sources 111a and 112a in order to remove heat generated by the heat sources 111a and 112a. In addition, the circulation pipe 200a has a circulation channel 210a for accommodating a first coolant 12a and allowing it to flow therethrough. The pump 300a and the heat exchanger 400a both are disposed on the circulation pipe 200a and communicated to the circulation channel 210a. The heat exchanger 400a helps to dissipate heat generated by the heat sources 111a and 112a and thereby cool the first coolant 12a. The power supply unit 500a provides electricity to the pump 300a. The pump 300a is able to force the first coolant 12a to flow through the circulation channel 210a.

In detail, the pump 300a forces the first coolant 12a to pass through the heat source 111a and absorbs heat generated by the heat source 111a, such that part of the first coolant 12a is vaporized into a gaseous state. Then, a mixture of gaseous and liquid first coolant 12a passes through the heat source 112a and absorbs heat generated by the heat source 112a, such that more of the first coolant 12a is vaporized into a gaseous state. Then, the mixture of gaseous and liquid first coolant 12a flows through the heat exchanger 400a, and the heat exchanger 400a dissipates the heat in the first coolant 12a so as to condense the first coolant 12a back to liquid form. Lastly, the first coolant 12a returns to the pump 300a and completes a circulation.

In the aforementioned circulation, part of the first coolant 12a in gaseous form may escape and then result in loss of the first coolant 12a, but the loss can be replenished via the first coolant replenishment device 600a, the second coolant replenishment device 700a and the third coolant replenishment device 800a. The first coolant replenishment device 600a, the second coolant replenishment device 700a and the third coolant replenishment device 800a are disposed on the circulation pipe 200a and communicated to the circulation channel 210a. The heat exchanger 400a is located between the heat source 112a and the pump 300a, the first coolant replenishment device 600a and the second coolant replenishment device 700a are located between the heat sources 111a and 112a, and the third coolant replenishment device 800a is located between the heat source 112a and the heat exchanger 400a. By this arrangement, the first coolant replenishment device 600a and the second coolant replenishment device 700a are able to replenish the loss of the first coolant 12a while the first coolant 12a passes through the heat source 111a, and the third coolant replenishment device 800a is able to replenish the loss of the first coolant 12a while the first coolant 12a passes through the heat source 112a. As a result, the timing of replenishing the first coolant 12a is able to be postponed, and it also maintains the first coolant 12a in a certain amount so as to enhance cooling effect.

In this embodiment, the first coolant replenishment device 600a, the second coolant replenishment device 700a and the third coolant replenishment device 800a are, for example, the same device, thus only the first coolant replenishment device 600a is described in detail in the following paragraphs. As shown in FIG. 2 and FIG. 3, the first coolant replenishment device 600a includes a liquid storage tank 610a, a connecting pipe 620a, a tapered tube 630a, a pivot 640a, a valve 650a, a push plate 660a, a stopper 680a and a driving member 690a.

The liquid storage tank 610a has an accommodating space 611a, an inner surface 612a, an inner side wall 617a, a liquid outlet 613a and a replenishing hole 614a. The inner surface 612a surrounds the accommodating space 611a, and the accommodating space 611a is configured to accommodate a second coolant 13a. The second coolant 13a and the first coolant 12a are the same, and the second coolant 13a is used to replenish the loss of the first coolant 12a. The inner side wall 617a is located on a side of the liquid storage tank 610a opposite to and away from the liquid outlet 613a, and the liquid outlet 613a and the replenishing hole 614a both are communicated to the accommodating space 611a. The second coolant 13a is injected into the circulation via the replenishing hole 614a, and there is a cap 6141a disposed at and covering the replenishing hole 614a to prevent the second coolant 13a from leaking.

In this embodiment, the liquid storage tank 610a is, for example, a casing that is permeable to light, such that it is convenient for users to observe the amount of the second coolant 13a in the accommodating space 611a. However, the present disclosure is not limited to the material of the liquid storage tank 610a. In some other embodiments, the liquid storage tank may be made of a material that is impermeable to light. In addition, the cap 6141a is optional. In some other embodiments, the cap 6141a may be replaced with a check valve.

The connecting pipe 620a is a T-shaped pipe that has a connecting channel 621a, a first opening 622a and two second openings 623a. The first opening 622a and the two second openings 623a are communicated to the connecting channel 621a. In other words, the first opening 622a and the two second opening 623a are respectively located at three ends of the connecting pipe 620a. In addition, the two second opening 623a are configured to be communicated to the circulation channel 210a.

The tapered tube 630a has a tapered channel 631a. One end of the tapered tube 630a is communicated to the liquid outlet 613a, and another end of the tapered tube 630a is communicated to the first opening 622a, such that the tapered channel 631a is communicated to the accommodating space 611a through the liquid outlet 613a and is communicated to the connecting channel 621a through the first opening 622a. That is, the liquid outlet 613a is communicated to the circulation channel 210a through the tapered channel 631a and the connecting channel 621a. A height of the tapered channel 631a is gradually increasing from a side of the tapered channel 631a close to the connecting pipe 620a to a side of the tapered channel 631a away from the connecting pipe 620a, and a height H1 of the side of the tapered channel 631a away from the connecting pipe 620a from a reference plane S, which is below the tapered tube 630a, is taller than a height H2 of the connecting pipe 620a from the reference plane S. In other words, the most upper edge of the tapered channel 631a is higher than the upper edge of the connecting pipe 620a.

In this embodiment, the liquid storage tank 610a further has a first stopping surface 615a and a second stopping surface 616a, and the second stopping surface 616a faces the first stopping surface 615a. The pivot 640a parallels to a surface of the second coolant 13a, and the valve 650a is located between the first stopping surface 615a and the second stopping surface 616a and is pivoted to the liquid storage tank 610a through the pivot 640a, such that the valve 650a is pivotably located between a closed position and an opened position. In detail, when the valve 650 is in the closed position, the valve 650a presses against the first stopping surface 615a so as to close the liquid outlet 613a. When the valve 650a is in the opened position, the valve 650a presses against the second stopping surface 616a and reveals the liquid outlet 613a. In this embodiment, the pivot range of the valve 650a is limited by the first stopping surface 615a and the second stopping surface 616a, so the valve 650a is prevented from being overly opened or entering into the accommodating space 611a. However, the first stopping surface 615a and the second stopping surface 616a are optional. For example, in some other embodiments, the liquid storage tank may only have the first stopping surface 615a or the second stopping surface 616a; in another embodiment, there may be no first stopping surface 615a and the second stopping surface 616a on the liquid storage tank.

In addition, a distance D1 between the pivot 640a and the upper edge 651a of the valve 650a is smaller than a distance D2 between the pivot 640a and the lower edge 652a of the valve 650a, such that an opening which is formed at the upper edge 651a when the valve 650a being in the opened position is smaller than an opening which is formed at the lower edge 652a when the valve 650a being in the opened position, and the reason about the aforementioned arrangement will be described later.

The push plate 660a is movably located in the accommodating space 611a. In this embodiment, the push plate 660a is movable toward or away from the liquid outlet 613a. The first coolant replenishment device 600a further includes a seal ring 670a disposed on the periphery of the push plate 660a and tightly in contact with the inner surface 612a of the liquid storage tank 610a. The stopper 680a protrudes from the inner surface 612a of the liquid storage tank 610a and is located between the liquid outlet 613a and the push plate 660a. The stopper 680a is configured to stop the push plate 660a in a predetermined position. In detail, the stopper 680a is located between the replenishing hole 614a and the push plate 660a, this ensures that when the push plate 660a presses against the stopper 680a, the second coolant 13a will not enter into a side of the push plate 660 away from the stopper 680a while replenishing the second coolant 13a. The driving member 690a is, for example, a compression spring, and the driving member 690a is located at a side of the push plate 660a away from the liquid outlet 613a. Two opposite ends of the driving member 690a respectively press against the push plate 660a and the inner side wall 617a, such that the driving member 690a is able to constantly apply a force on the push plate 660a in the direction toward the liquid outlet 613a, thereby increasing the liquid pressure. The increase of the liquid pressure helps to force the second coolant 13a in the accommodating space 611a to move the valve 650a from the closed position to the opened position, allowing the second coolant 13a to be injected into the circulation channel 210a via the through the liquid outlet 613a.

Figure 4:
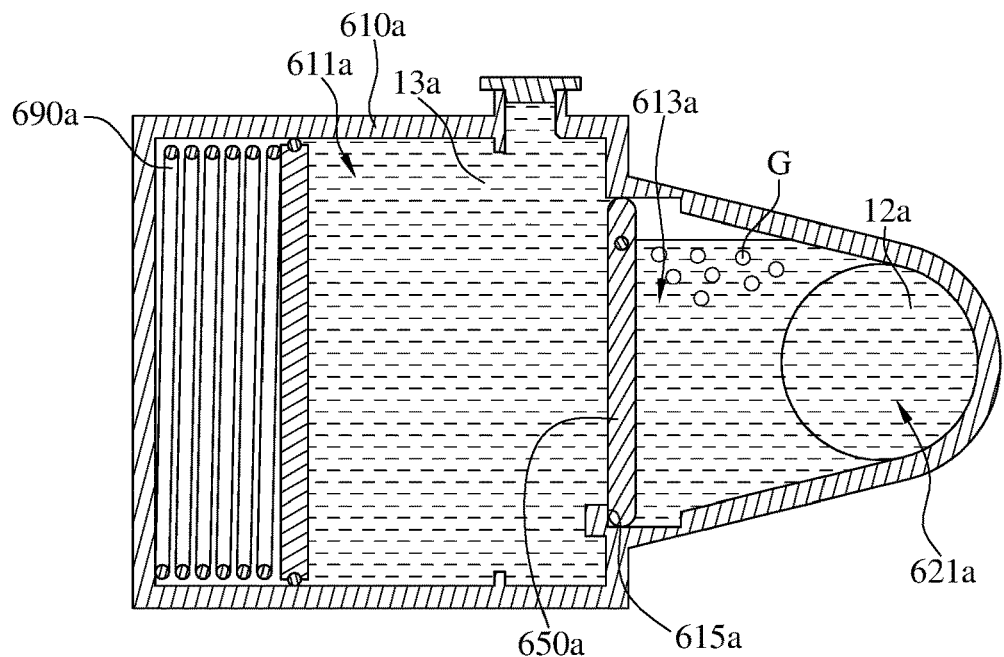
FIG. 4 is a cross-sectional view of the coolant replenishment device in FIG. 3 when the valve is closed and the pressure is unbalanced.
Figure 5:
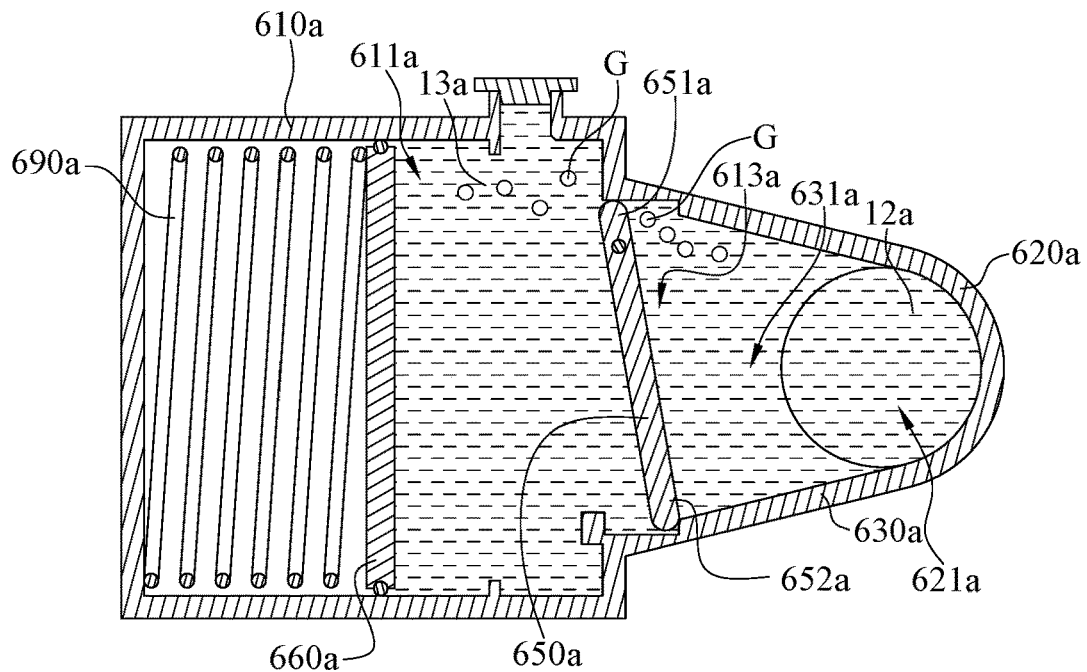
FIG. 5 is a cross-sectional view of the coolant replenishment device in FIG. 3 when the valve is opened to balance the pressure.

Then, the process of the second coolant 13a entering into the circulation pipe 200a is described in the following paragraphs. Please refer to FIG. 4 and FIG. 5. FIG. 4 is a cross-sectional view of the coolant replenishment device in FIG. 3 when the valve is closed and the pressure is unbalanced. FIG. 5 is a cross-sectional view of the coolant replenishment device in FIG. 3 when the valve is opened to balance the pressure.

At first, as shown in FIG. 4, while the electronic device 10a is in operation, the first coolant 12a in the circulation channel 210a absorbs heat generated by the heat sources 111a and 112a, such that part of the first coolant 12a is vaporized into gas G, resulting in reduction of the first coolant 12a. When the amount of the gas G does not yet exceed a predetermined value, the amount of the liquid form of the first coolant 12a is still sufficient, such that a pressure difference value between the sum of the force applied by the driving member 690a and the pressure of the second coolant 13a in the liquid storage tank 610a and the pressure of the first coolant 12a in the connecting channel 621a is smaller than a critical pressure difference value which allows the valve 650a to be opened. Thus, at this moment, the valve 650a is in the closed position, as shown in FIG. 3. That is, when the amount of the gas G does not yet exceed the predetermined value, the valve 650a is pressed against the first stopping surface 615a and thereby closes the liquid outlet 613a. As a result, the accommodating space 611a is not communicated to the circulation channel 210a.

As shown in FIG. 5, with the increase of the amount of the gas G, the pressure of the first coolant 12a in the connecting channel 621a become much smaller than the sum of the force applied by the driving member 690a and the pressure of the second coolant 13a in the liquid storage tank 610a, such that the pressure difference between the sum of the force applied by the driving member 690a and the pressure of the second coolant 13a in the liquid storage tank 610a and the first coolant 12a in the connecting channel 621a is larger than the critical pressure difference value, and allows the push plate 660a move toward the liquid outlet 613a. At this moment, the second coolant 13a pushed by the push plate 660a moves the valve 650a to the opened position, such that the liquid outlet 613a is opened and allows the second coolant 13a in the liquid storage tank 610a to enter into the circulation channel 210a to replenish the loss of the first coolant 12a through the tapered tube 630a and the connecting pipe 620a. During the replenishing, the pressures at the two opposite sides of the valve 650a gradually become balanced.

In addition, as discussed in above, the height of the tapered channel 631a is increasing from the side of the tapered channel 631a close to the connecting pipe 620a to the side of the tapered channel 631 away from the connecting pipe 620a, and the gas G has lower density. This causes the gas G to enter into the tapered tube 630a through the connecting channel 621a and then go along the inner wall of the tapered tube 630a to reach the upper edge 651a of the valve 650a. Furthermore, when the valve 650a is in the opened position, the opening at upper edge 651a being smaller than the opening at lower edge 652a ensures that the gas G enters into the accommodating space 611a through the opening at the upper edge 651a, and the second coolant 13a enters into the connecting channel 621a through the opening at the lower edge 652a. As such, the tapered channel 631a and the opening at the upper edge 651a helps the gas G in the circulation channel 210a to be discharged from the circulation channel 210a and then accumulated in the accommodating space 611a so as to ensure that the first coolant 12a in the circulation channel 210a is only in liquid form, thereby improving the heat dissipation capability of the electronic device 10a.

Figure 6:
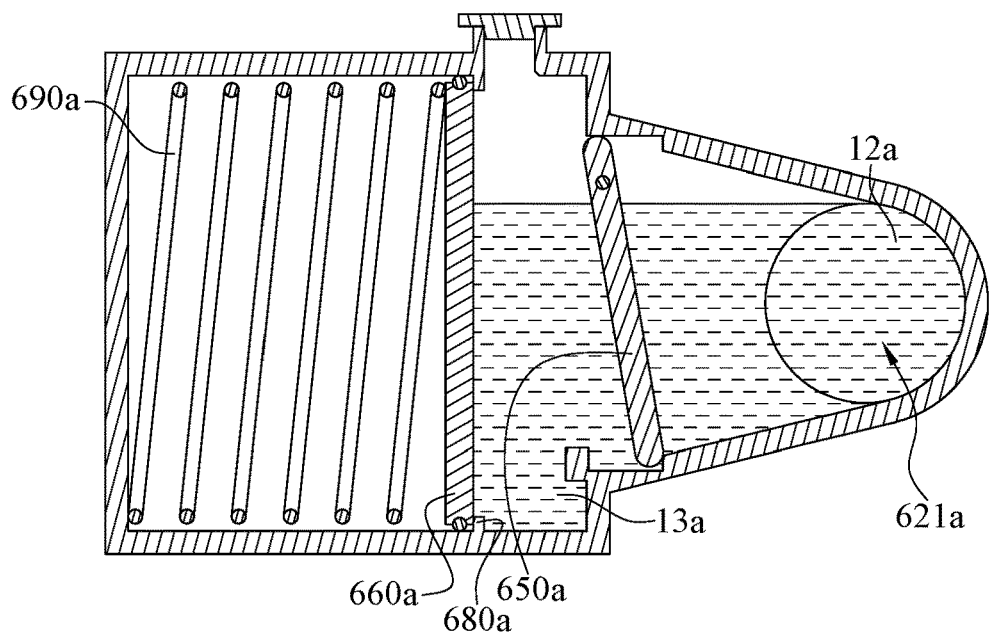
FIG. 6 is a cross-sectional view of the coolant replenishment device in FIG. 3 when a push plate is pressed against a stopper.
Figure 7:
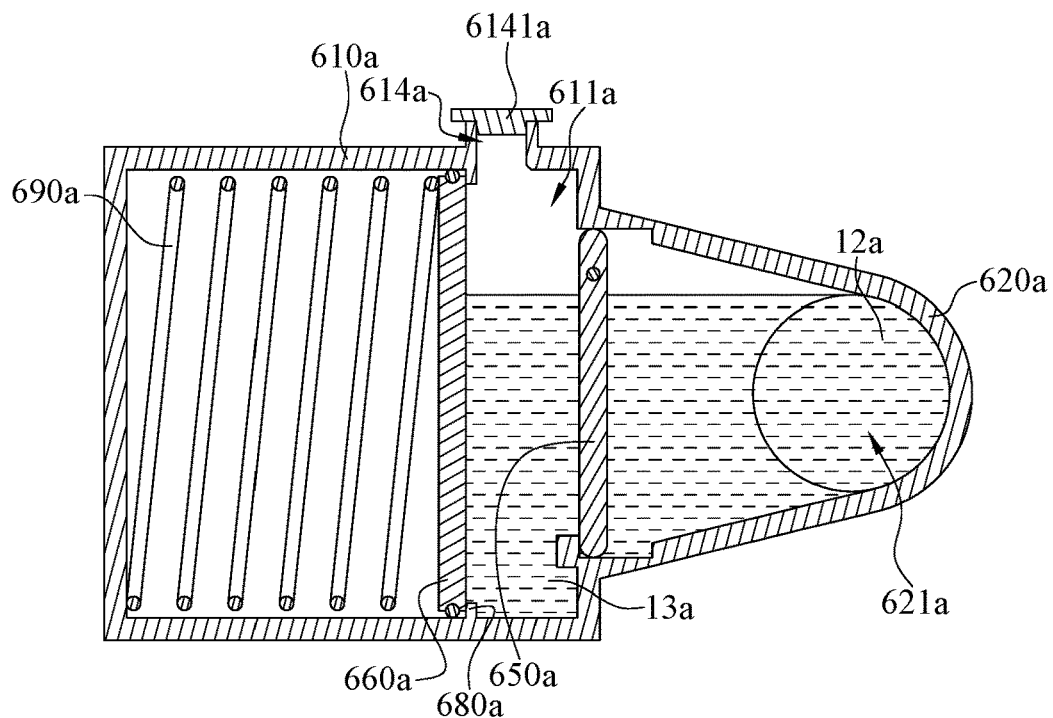
FIG. 7 is a cross-sectional view of the coolant replenishment device in FIG. 3 while the valve is in a closed position.

Then, please refer FIG. 6 and FIG. 7. FIG. 6 is a cross-sectional view of the coolant replenishment device in FIG. 3 when a push plate is pressed against a stopper. FIG. 7 is a cross-sectional view of the coolant replenishment device in FIG. 3 while the valve is in a closed position.

After the liquid cooling circulation has been operated for a long time, the first coolant 12a in the circulation channel 210a becomes fewer and fewer, meaning that the pressure of the first coolant 12a gradually decreases. As a result, the push plate 660a is eventually pressed against the stopper 680a by the driving member 690a, and the second coolant 13a which was originally located in the liquid storage tank 610a have been entered into the circulation channel 210a through the connecting channel 621a to become part of the first coolant 12a. At this moment, as shown in FIG. 7, the push plate 660a no longer provides pressure on the second coolant 13a. However, the pump 300a still constantly provides pressure in the liquid storage tank 610a, thus the pressure of the first coolant 12a in the connecting channel 621a becomes greater than the pressure at the side of the valve 650a away from the connecting pipe 620a, such that the valve 650a returns to the closed position (as shown in FIG. 7). Therefore, the first coolant 12a is prevented from flowing into the liquid storage tank 610a, thereby maintaining the heat dissipation capability.

In this embodiment, since the liquid storage tank 610a is permeable to light, the amount of the second coolant 13a can be determined from the outside of the liquid storage tank 610a by checking whether the push plate 660a presses against the stopper 680a. However, in the case that the liquid storage tank 610a is impermeable to light, the amount of the remaining second coolant 13a in the liquid storage tank 610a may be determined by detecting the increase of the temperature of the CPU. The reason is that the performance of the electronic device 10a would be deteriorated if there is no second coolant 13a to replenish the loss of the first coolant 12a. Alternatively, in some other embodiments, a sensor (e.g. a pressure sensor or a touching switch) may be disposed in the liquid storage tank 610a to detect whether the push plate 660a is in the predetermined position (e.g. the position of the push plate 660a in FIG. 7). If the push plate 660a is in the predetermined position, the sensor would submit a warning signal.

In addition, the cap 6141a can be removed so as to discharge the gas G accumulated at the top of the accommodating space 611a, and then the accommodating space 611a can be refilled with the second coolant 13a. During refilling, the second coolant 13a not only pushes the push plate 660a away from the liquid outlet 613a and compresses the driving member 690a, but also pivots the valve 650a so that the second coolant 13a can replenish the loss of the first coolant 12a. When the refilling and the replenishment are finished, the valve 650a returns to the closed position (as shown in FIG. 3).

In this embodiment, the coolant replenishment devices 600a, 700a and 800a all have the driving member 690a to force the push plate 660a to push the second coolant 13a into the circulation channel 210a such that the coolant replenishment devices 600a, 700a and 800a are still able to replenish the loss of the first coolant 12a under a condition that there is no height difference between each of the coolant replenishment devices 600a, 700a and 800a and the circulation pipe 200.

In this embodiment, there are three coolant replenishment devices (i.e. the coolant replenishment devices 600a, 700a and 800a), but the present disclosure is not limited to the quantity of the coolant replenishment devices. In some other embodiments, the quantity of the coolant replenishment device may be adjusted according to the actual requirements. The quantity of the coolant replenishment devices is related to the amount of the coolant for replenishment and to the frequency of the refilling.

In addition, the locations of the first coolant replenishment device 600a, the second coolant replenishment device 700a and the third coolant replenishment device 800a are not restricted. In some other embodiments, the locations of these coolant replenishment devices may be adjusted according to the actual requirements. In some cases, the heat dissipation capability of the electronic device may be improved by changing the quantity and the locations of the coolant replenishment devices.

Moreover, the tapered channel 631a and the opening at the upper edge 651a helps the gas G in the circulation channel 210a to be discharged from the circulation channel 210a so as to ensure that the first coolant 12a in the circulation channel 210a is only in liquid form, thereby improving the heat dissipation capability of the electronic device 10a.

In addition, the present disclosure is not limited to how to move the push plate 660a.

Figure 8:
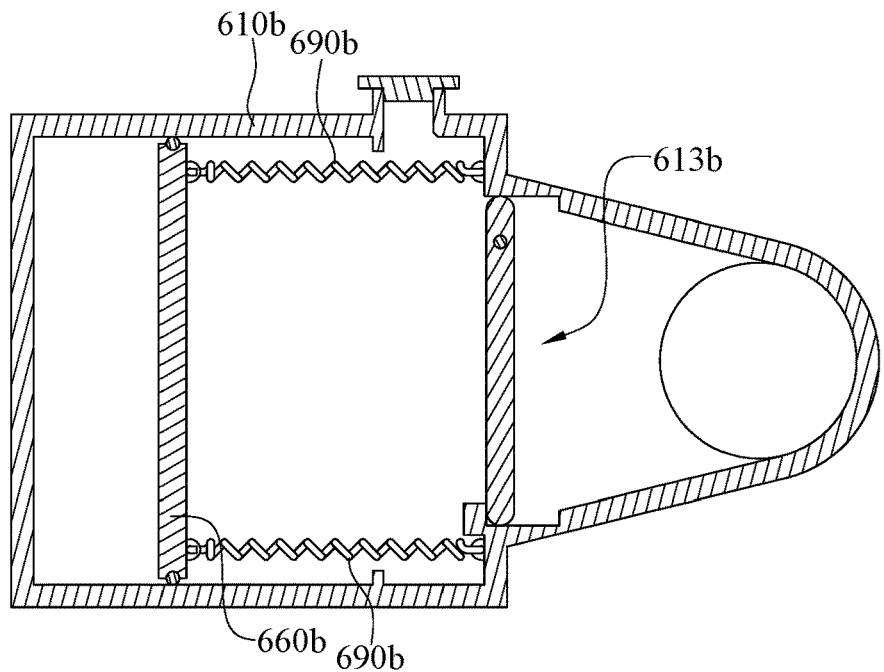
FIG. 8 is a cross-sectional view of a coolant replenishment device according to a second embodiment of the disclosure.

Please refer to FIG. 8. FIG. 8 is a cross-sectional view of a coolant replenishment device according to a second embodiment of the disclosure. This embodiment provides a coolant replenishment device 600b. The coolant replenishment device 600b includes two driving members 690b that are extension springs and disposed on a side of a push plate 660b close to a liquid outlet 613b. Two opposite ends of each driving member 690b are connected to the push plate 660b and the liquid storage tank 610b, such that the push plate 660b can be moved toward the liquid outlet 613b by being pulled by the driving members 690b.

Figure 9:
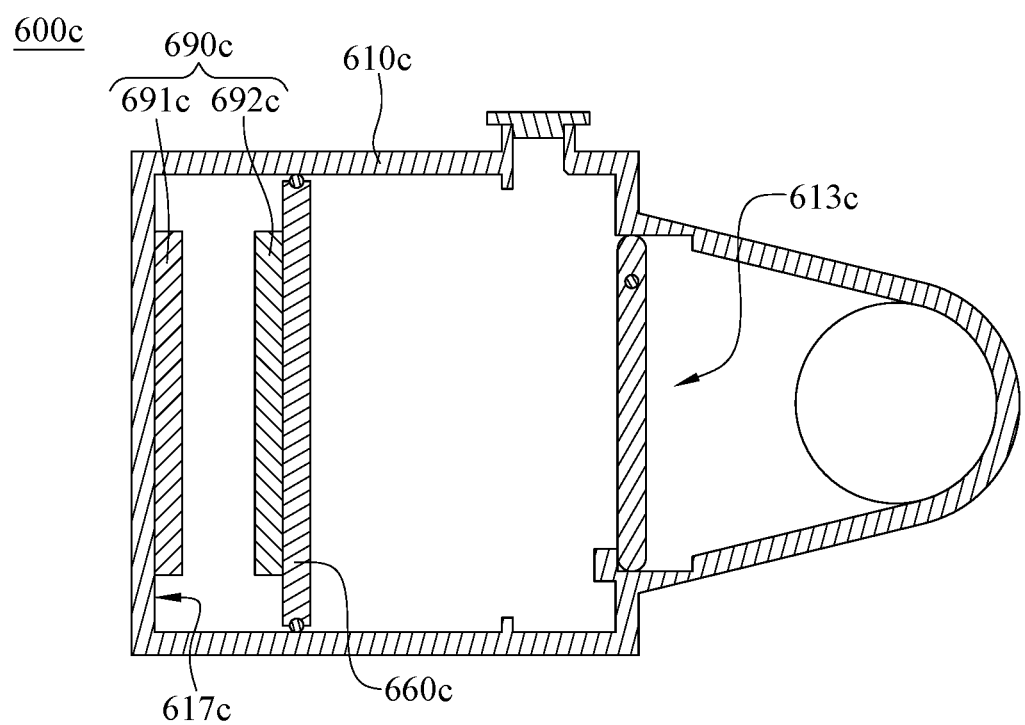
FIG. 9 is a cross-sectional view of a coolant replenishment device according to a third embodiment of the disclosure.

Alternatively, please refer to FIG. 9. FIG. 9 is a cross-sectional view of a coolant replenishment device according to a third embodiment of the disclosure. This embodiment provides a coolant replenishment device 600c. The coolant replenishment device 600c includes a first magnetic component 691c and a second magnetic component 692c. A surface of the first magnetic component 691c and a surface of the second magnetic component 692c facing each other have the same magnetic pole. The first magnetic component 691c and the second magnetic component 692c both are located at a side of a push plate 660c away from a liquid outlet 613c. The first magnetic component 691c is fixed on an inner side wall 617c, and the second magnetic component 692c is fixed on a push plate 660c, such that the push plate 660c can be moved toward the liquid outlet 613c by the repulsion of the first magnetic component 691c and the second magnetic component 692c.

However, the present disclosure is not limited to the embodiments in FIG. 8 and FIG. 9, either. In some other embodiments, the driving member may be a piston device which is able to do a back and forth movement to force the second coolant to enter into the circulation channel.

Figure 10:
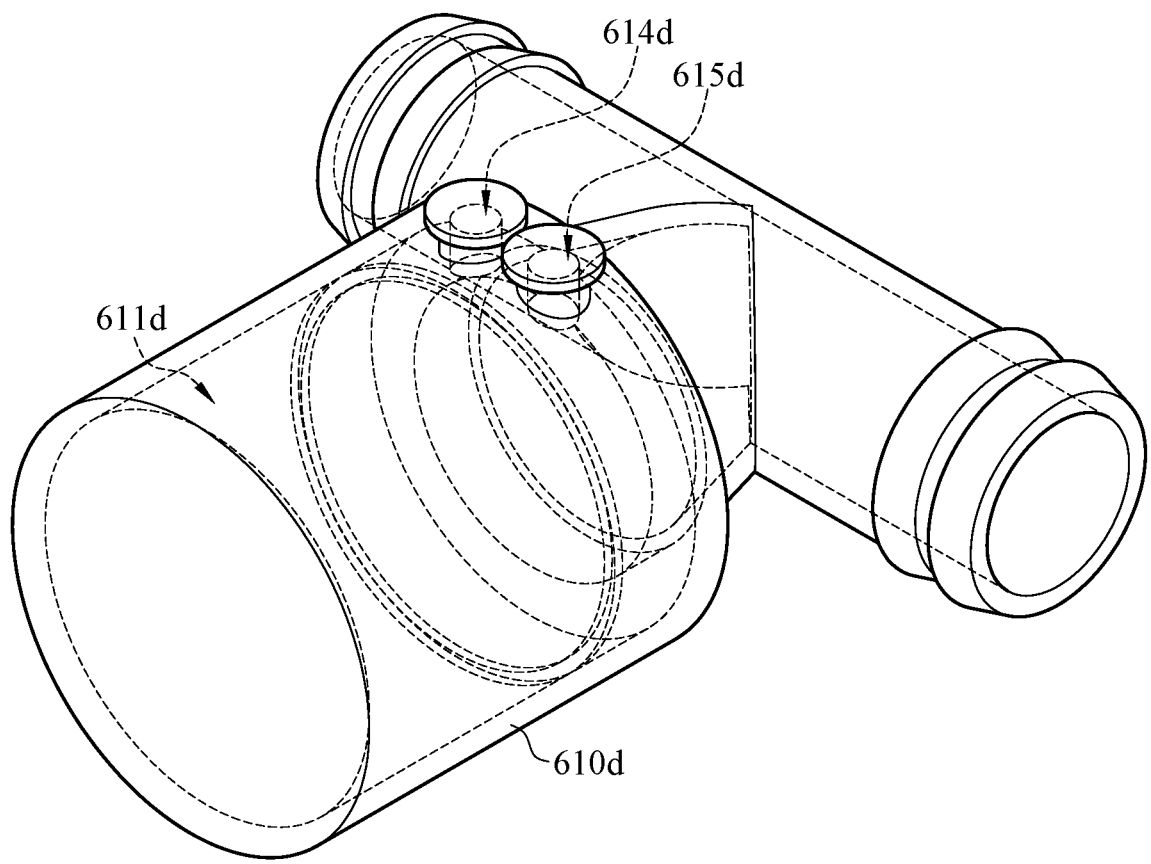
FIG. 10 is a cross-sectional view of a coolant replenishment device according to a fourth embodiment of the disclosure.

In the aforementioned embodiments, the replenishing hole is uses to refill the second coolant and discharge the gas, but the present disclosure is not limited thereto. Please refer to FIG. 10. FIG. 10 is a cross-sectional view of a coolant replenishment device according to a fourth embodiment of the disclosure. This embodiment provides a coolant replenishment device 600d. The coolant replenishment device 600d includes a liquid storage tank 610d, and the liquid storage tank 610d not only has a replenishing hole 614d, but also has an air outlet 615d communicated to an accommodating space 611d. In this embodiment, the replenishing hole 614d is used to refill the second coolant 13a, and the air outlet 615d is used to discharge the gas.

In addition, in some other embodiments, the coolant replenishment device may have no valve as mentioned in above; in such a case, the constant force applied by the driving member is able to push the second coolant directly into the circulation pipe.

According to the electronic device as discussed above, since it includes at least one coolant replenishment device which is disposed on the circulation pipe and includes the driving member and the push plate for automatically replenish coolant into the circulation, the replenishment device is still able to replenish the loss of the first coolant under a condition that there is no height difference between the replenishment devices and the circulation pipe.

In addition, the coolant replenishment device not only can replenish the loss of the first coolant in the circulation pipe, but also can decrease the frequency of refilling the second coolant, thereby maintaining the heat dissipation capability of the electronic device.

Moreover, the heat dissipation capability can be increased by adjusting the quantity and the location of the coolant replenishment device.

Furthermore, the tapered channel and the opening at the upper edge helps the gas in the circulation channel to be discharged from the circulation channel so as to ensure that the first coolant in the circulation channel is only in liquid form, thereby improving the heat dissipation capability of the electronic device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A coolant replenishment device, adapted to be connected to a circulation pipe having a circulation channel, comprising:
   - a liquid storage tank having an accommodating space and a liquid outlet, the liquid outlet communicated to the accommodating space, and the accommodating space configured to accommodating a coolant for replenishment;
   - a push plate movably located in the accommodating space and movable in a direction toward or away from the liquid outlet; and
   - a driving member disposed in the liquid storage tank and constantly applying a force on the push plate in the direction toward the liquid outlet so as to force the push plate to move toward the liquid outlet to push the coolant out of the accommodating space,
   - wherein the coolant replenishment device further comprises a valve and a connecting pipe, the valve is pivotably located in the accommodating space, the connecting pipe has a connecting channel and a first opening, the connecting channel is optionally communicated to the accommodating space through the first opening by opening or closing of the valve, the connecting channel is configured to be communicated to the circulation channel of the circulation pipe, and the valve is located between the push plate and the first opening of the connecting pipe.

2. The coolant replenishment device according to the claim 1, wherein the valve has a closed position and an opened position, wherein when the valve is in the closed position, the valve closes the liquid outlet, and when the valve is in the opened position, the valve opens the liquid outlet.

3. The coolant replenishment device according to the claim 2, further comprising a pivot, wherein the valve is pivoted in the liquid storage tank through the pivot, and the pivot parallels to a surface of the coolant.

4. The coolant replenishment device according to the claim 3, wherein a distance between the pivot and an upper edge of the valve is smaller than a distance between the pivot and a lower edge of the valve.

5. The coolant replenishment device according to the claim 2, wherein the liquid storage tank has a first stopping surface and a second stopping surface, the second stopping surface faces the first stopping surface, and the valve is located between the first stopping surface and the second stopping surface.

6. The coolant replenishment device according to the claim 1, wherein the liquid storage tank has an inner surface surrounding the accommodating space, and the coolant replenishment device further comprises a seal ring which is disposed on the periphery of the push plate and is tightly in contact with the inner surface.

7. The coolant replenishment device according to the claim 1, wherein the liquid storage tank has an inner side wall which is opposite to and away from the liquid outlet, the driving member is a compression spring, the driving member is located on a side of the push plate away from the liquid outlet, and two opposite ends of the driving member respectively press against the inner side wall and the push plate.

8. The coolant replenishment device according to the claim 1, wherein the driving member is an extension spring, and the driving member is located on a side of the push plate close to the liquid outlet.

9. The coolant replenishment device according to the claim 1, wherein the liquid storage tank has an inner side wall which is opposite to and away from the liquid outlet, the driving member comprises a first magnetic component and a second magnetic component, a surface of the first magnetic component and a surface of the second magnetic component facing each other have the same magnetic pole, the first magnetic component and the second magnetic component both are located on a side of the push plate away from the liquid outlet, the first magnetic component is fixed on the inner side wall, and the second magnetic component is fixed on the push plate.

10. The coolant replenishment device according to the claim 1, further comprising a stopper which protrudes from an inner surface of the liquid storage tank and is located between the liquid outlet and the push plate, wherein the stopper is configured to stop the movement of the push plate in a predetermined position.

11. The coolant replenishment device according to the claim 1, wherein the liquid storage tank further has a replenishing hole which is communicated to the accommodating space, and the replenishing hole is located above the push plate and the valve.

12. The coolant replenishment device according to the claim 1, wherein the liquid storage tank further has an air outlet which is communicated to the accommodating space, and the air outlet is located above the push plate and the valve.

13. The coolant replenishment device according to the claim 1, wherein the connecting pipe has a two second openings, wherein the first opening and the two second openings are communicated to the connecting channel.

14. The coolant replenishment device according to the claim 13, further comprising a tapered tube having a tapered channel, one end of the tapered tube communicated to the liquid outlet, another end of the tapered tube communicated to the first opening so that the tapered channel is communicated to the accommodating space through the liquid outlet and is connected communicated to the connecting channel through the first opening, wherein a height of the tapered channel is gradually increasing from a side of the tapered channel close to the connecting pipe to a side of the tapered channel away from the connecting pipe, and a height of the side of the tapered channel away from the connecting pipe from a reference plane which is below the tapered tube is taller than a height of the connecting pipe from the reference plane.

15. A cooling circulation system, comprising:
a circulation pipe having a circulation channel configured to accommodating a first coolant;
a pump disposed on the circulation pipe and configured to force the first coolant to flow through the circulation channel; and
a coolant replenishment device disposed on and connected to the circulation pipe, and the coolant replenishment device comprising:
a liquid storage tank having an accommodating space and a liquid outlet, the liquid outlet communicated to the accommodating space and the circulation channel, and the accommodating space is configured to accommodating a second coolant;
a push plate movably located in the accommodating space and movable in a direction toward or away from the liquid outlet; and
a driving member disposed in the liquid storage tank and constantly applying a force on the push plate in the direction toward the liquid outlet so as to force the push plate to move toward the liquid outlet to push the second coolant from the accommodating place into the circulation channel through the liquid outlet,
wherein the coolant replenishment device further comprises a valve and a connecting pipe, the valve is pivotably located in the accommodating space, the connecting pipe has a connecting channel and a first opening, the connecting channel is optionally communicated to the accommodating space through the first opening by opening or closing of the valve, the connecting channel is communicated to the circulation channel of the circulation pipe, and the valve is located between the push plate and the first opening of the connecting pipe.

16. The cooling circulation system according to the claim 15, wherein the valve has a closed position and an opened position, wherein when the valve is in the closed position, the valve closes the liquid outlet, and when the valve is in the opened position, the valve opens the liquid outlet.

17. The cooling circulation system according to the claim 15, wherein the connecting pipe is a T-shaped pipe, the connecting pipe further has two second openings, the first opening and the two second openings are communicated to the connecting channel, and the two second openings are communicated to the circulation pipe.

18. The cooling circulation system according to the claim 17, further comprising a tapered tube, wherein the tapered tube has a tapered channel, an end of the tapered tube is communicated to the liquid outlet, the other end of the tapered tube is communicated to the first opening, such that the tapered channel is communicated to the accommodating space through the liquid outlet and is communicated to the connecting channel through the first opening, and a height of the tapered channel is gradually increasing from a side of the tapered channel close to the connecting pipe to a side of the tapered channel away from the connecting pipe.

19. An electronic device, comprising:
a heat source configured to produce heat;
a circulation pipe in thermal contact with the heat source so as to remove part of the heat, wherein the circulation pipe has a circulation channel configured to accommodate a first coolant;
a pump disposed on the circulation pipe and configured to force the first coolant to flow through the circulation channel;
a heat exchanger disposed on the circulation pipe and configured to dissipate the heat to cool the first coolant; and
a coolant replenishment device disposed on and connected to the circulation pipe, and the coolant replenishment device comprising:
a liquid storage tank having an accommodating space and a liquid outlet, the liquid outlet communicated to the accommodating space and the circulation channel, and the accommodating space is configured to accommodating a second coolant for replenishment;
a push plate movably located in the accommodating space and movable in a direction toward or away from the liquid outlet; and
a driving member disposed in the liquid storage tank and constantly applying a force on the push plate in the direction toward the liquid outlet so as to force the push plate to move toward the liquid outlet to push the second coolant from the accommodating place into the circulation channel through the liquid outlet,
wherein the coolant replenishment device further comprises a valve and a connecting pipe, the valve is pivotably located in the accommodating space, the connecting pipe has a connecting channel and a first opening, the connecting channel is optionally communicated to the accommodating space through the first opening by opening or closing of the valve, the connecting channel is communicated to the circulation channel of the circulation pipe, and the valve is located between the push plate and the first opening of the connecting pipe.

20. The electronic device according to the claim 19, wherein the valve has a closed position and an opened position, wherein when the valve is in the closed position, the valve closes the liquid outlet, and when the valve is in the opened position, the valve opens the liquid outlet.

21. The electronic device according to the claim 19, wherein the connecting pipe is a T-shaped pipe, the connecting pipe further has two second openings, the first opening and the two second openings are communicated to the connecting channel, and the two second openings are communicated to the circulation pipe.

22. The electronic device according to the claim 21, wherein the coolant replenishment device further comprises a tapered tube, the tapered tube has a tapered channel, an end of the tapered tube is communicated to the liquid outlet, the other end of the tapered tube is communicated to the first opening, such that the tapered channel is communicated to the accommodating space through the liquid outlet and is communicated to the connecting channel through the first opening, and a height of the tapered channel is gradually increasing from a side of the tapered channel close to the connecting pipe to a side of the tapered channel away from the connecting pipe.

23. The electronic device according to the claim 19, wherein the heat exchanger is located between the pump and the heat source, and the coolant replenishment device is located between the pump and the heat source.

* * * * *